(12) United States Patent
Wong et al.

(10) Patent No.: US 10,497,741 B2
(45) Date of Patent: Dec. 3, 2019

(54) APPARATUS AND METHODS FOR OPTICAL EMISSION DETECTION

(71) Applicant: Board of Regents, The University of Texas System, Austin, TX (US)

(72) Inventors: Wai-hoi Wong, Houston, TX (US); Hongdi Li, Pearland, TX (US); Rocio Alicia Ramirez-Jaramillo, Aguada, PR (US); Yuxuan Zhang, Pearland, TX (US); Hossain Baghaei, Sugar Land, TX (US)

(73) Assignee: Board of Regents, The University of Texas System, Austin, TX (US)

( * ) Notice: Subject to any disclaimer, the term of this patent is extended or adjusted under 35 U.S.C. 154(b) by 0 days.

(21) Appl. No.: 16/068,168

(22) PCT Filed: Jan. 4, 2017

(86) PCT No.: PCT/US2017/012143
§ 371 (c)(1),
(2) Date: Jul. 5, 2018

(87) PCT Pub. No.: WO2017/120201
PCT Pub. Date: Jul. 13, 2017

(65) Prior Publication Data
US 2019/0019837 A1 Jan. 17, 2019

Related U.S. Application Data

(60) Provisional application No. 62/274,866, filed on Jan. 5, 2016.

(51) Int. Cl.
*G01T 1/20* (2006.01)
*G01T 1/202* (2006.01)
(Continued)

(52) U.S. Cl.
CPC ........ *H01L 27/14663* (2013.01); *G01T 1/164* (2013.01); *G01T 1/1642* (2013.01);
(Continued)

(58) Field of Classification Search
CPC .......... G01T 1/202; G01T 1/29; G01T 1/2002
See application file for complete search history.

(56) References Cited

U.S. PATENT DOCUMENTS

| 6,943,355 B2 * | 9/2005 | Shwartz | G01T 1/1644 250/363.04 |
| 7,193,208 B1 | 3/2007 | Burr et al. | |

(Continued)

FOREIGN PATENT DOCUMENTS

| KR | 2010-0069295 | 6/2010 |
| RU | 2017170 | 7/1994 |

(Continued)

OTHER PUBLICATIONS

International Search Report and Written Opinion issued in corresponding PCT Application No. PCT/US27/12143, dated Apr. 7, 2017.

(Continued)

*Primary Examiner* — David P Porta
*Assistant Examiner* — Djura Malevic
(74) *Attorney, Agent, or Firm* — Parker Highlander PLLC (57) ABSTRACT

Apparatus and methods for optical emission detection comprising scintillating proximal sensors.

28 Claims, 5 Drawing Sheets

(51) Int. Cl.
*G01T 1/29* (2006.01)
*H01L 27/146* (2006.01)
*G01T 1/164* (2006.01)
*H01L 31/09* (2006.01)

(52) U.S. Cl.
CPC .............. *G01T 1/20* (2013.01); *G01T 1/2002* (2013.01); *G01T 1/202* (2013.01); *G01T 1/29* (2013.01); *H01L 31/09* (2013.01)

(56) References Cited

U.S. PATENT DOCUMENTS

| | | | |
|---|---|---|---|
| 7,238,946 | B2 | 7/2007 | Joung et al. |
| 7,291,841 | B2 | 11/2007 | Nelson |
| 7,378,659 | B2 | 5/2008 | Burr et al. |
| 7,626,389 | B2 | 12/2009 | Fiedler et al. |
| 7,671,339 | B2 | 3/2010 | Shibuya et al. |
| 8,115,174 | B2 | 2/2012 | Nelson |
| 8,384,040 | B2 | 2/2013 | Tauchi et al. |
| 8,405,038 | B2 | 3/2013 | Bouhnik et al. |
| 8,809,790 | B2 | 8/2014 | Woldemichael |
| 8,849,002 | B2 | 9/2014 | Chinn et al. |
| 8,946,643 | B2 | 2/2015 | McCroskey et al. |
| 8,963,093 | B2 | 2/2015 | McCroskey et al. |
| 9,158,010 | B2 * | 10/2015 | Osawa .................. G01T 1/202 |
| 2004/0251419 | A1 * | 12/2004 | Nelson .................. G01T 1/243 250/370.09 |
| 2005/0253073 | A1 | 11/2005 | Joram et al. |
| 2007/0096031 | A1 | 5/2007 | Meier |
| 2009/0134334 | A1 * | 5/2009 | Nelson ................. G01T 1/2002 250/361 R |
| 2011/0192982 | A1 | 8/2011 | Henseler et al. |
| 2012/0307025 | A1 | 12/2012 | Lerche et al. |
| 2013/0009067 | A1 | 1/2013 | Schmand |
| 2013/0028379 | A1 | 1/2013 | Nelson |
| 2013/0112884 | A1 * | 5/2013 | Osawa .................. G01T 1/202 250/366 |
| 2013/0153774 | A1 | 6/2013 | Hughes et al. |
| 2013/0153776 | A1 | 6/2013 | Wieczorek et al. |
| 2014/0021354 | A1 | 1/2014 | Gagnon |
| 2014/0110592 | A1 | 4/2014 | Nelson |
| 2014/0138548 | A1 | 5/2014 | Li et al. |
| 2014/0264041 | A1 | 9/2014 | Schulz |
| 2015/0028218 | A1 * | 1/2015 | Kataoka ................ G01T 1/1644 250/367 |

FOREIGN PATENT DOCUMENTS

| | | |
|---|---|---|
| WO | WO 2013/166574 | 11/2013 |
| WO | WO 2014/181232 | 11/2014 |

OTHER PUBLICATIONS

Peng and Levin, "Recent Developments in PET Instrumentation", *Curr. Pharm. Biotechnol.*, 11:555-571, 2010.

Schulz et al., "Sensitivity encoded silicon photomultiplier—a new sensor for high-resolution PET-MRI", *Phys. Med. Biol.*, 58:4733-4748, 2013.

Shah et al., "Positron Sensitive APDs for Small Animal PET Imaging", *IEEE Trans. Nuclear Sci.*, 51(1):91-95, 2004.

Vandenbroucke et al., "Performance characterization of a new high resolution PET scintillation detector", *Phys. Med. Biol.*, 55(19):5895-5911, 2010.

* cited by examiner

APPARATUS AND METHODS FOR OPTICAL EMISSION DETECTION

CROSS-REFERENCE TO RELATED APPLICATIONS

This application is a national phase application under 35 U.S.C. § 371 of International Application No. PCT/US2017/012143, filed Jan. 4, 2017, which claims priority to U.S. Provisional Patent Application Ser. No. 62/274,866, filed Jan. 5, 2016, and entitled "Apparatus and Methods for Optical Emission Detection," the entire contents of each of which are incorporated herein by reference.

GOVERNMENT LICENSE RIGHTS

This invention was made with government support under grant number R01 EB001038 awarded by the National Institutes of Health. The government has certain rights in the invention.

BACKGROUND INFORMATION

Medical Imaging devices that provide both morphological and molecular-functional information in one imaging session have gained acceptance as the diagnostic imaging tools of choice, because of the substantial increase in benefit for patients and physicians. Currently, almost all positron emission tomography (PET) systems sold have an integrated computed tomography (CT) scanner. In spite of the good performance of PET-CT systems, such devices are limited by (a) the low soft-tissue contrast of CT, and (b) the lack of simultaneous PET-CT image acquisition prohibiting the correction of organ/patient motion artifacts and the misregistration in the fused images. Therefore to overcome these handicaps, a novel approach is to integrate PET with a magnetic resonance (MR) system [23].

The integration of PET and MR has several advantages, including: (a) superior and flexible contrast for soft tissue, improving cancer diagnosis such as prostate imaging; (b) since 4D (x, y, z, t) MRI imaging can be acquired simultaneously with PET acquisition, PET-MR will have accurate image fusion, correction for motion artifacts, misregistration and 4D attenuation correction; (c) the much higher resolution of MR can be used for correcting the partial-volume effect of the lower resolution PET images to provide more accurate PET quantitation and diagnosis; (d) MR does not impart radiation dose to patients as CT scans that has caused concern in recent years; (e) one can study the correlation of functional MRI studies and PET blood-flow measurements; (f) PET metabolic studies and MR protein spectroscopy can be synergized in the study of metabolism.

However, since MR images show proton density and tissue-relaxation properties and not electron density and mass density, the PET attenuation correction using MR is more complicated than CT.

Despite MR-PET's enormous potential, its high cost is a major barrier preventing the wide availability of MR-PET. A whole-body PET-MR without time-of-flight capability cost $5 million, which is much more than that of the combined stand-alone 3T MR and a stand-along PET ($3.5 million). Furthermore, despite the high-cost technology, current whole-body MR-PET from Siemens, a leader in MR-PET technology, has an intrinsic PET resolution of 4.3-mm that is no better than the resolution of the Siemens PET-CT for the last two decades.

Proposed herein is a new MR-PET detector design that can reduce the costly MR-PET detector system substantially and provides superior PET imaging resolution to the current MR-PET systems. This novel design has another important feature that it is scalable (stretchable) so the design can achieve resolution from 1-mm for preclinical imaging to 2.5 mm (or better) for human imaging, improving the current 4-5 mm human MR-PET resolution.

In addition, with the scalable-detector characteristics, its detector-processing electronics do not change with the detector-array dimensions or detector-pixel sizes, unlike current PET-MR using fixed SiPM panels. Hence, the same detector-readout electronics made for one detector type (e.g., mouse MR-PET) can also be used for the large human MR-PET, thereby minimizing the effort/cost of electronic development for different MR-PET systems.

Hence, embodiments disclosed herein could yield one comprehensive detector-platform technology that yields ultrahigh-resolution detectors and electronics from preclinical MR-PET, to whole-body MR-PET, to organ-specific MR-PET such as breast MR-PET and brain MR-PET. The novel elasticity of the proposed detector design can be demonstrated by implementing MR-PET detectors for different imaging applications and resolutions.

In addition, this low-cost and flexible MR-PET detector technology can create low-cost depth-of-interaction-localizing (DOI) detectors to improve the off-center image blurring from DOI effect that is well known but has not been solved cost-effectively. The latest clinical MR-PET and PET-CT systems still do not have the DOI capability after more than 30 years of research in DOI detectors. The enabling of low-cost DOI PET detector with the proposed design is significant for realizing ultrahigh resolution MR-PET, because the MR bore is small, about 70 cm, and the entire PET detector ring and front-end electronics has to be inside this 70 cm diameter. Hence the Siemens whole-body MR-PET detector ring has to be reduced to a small 65-cm, much smaller than the PET-CT's 85-cm detector-diameter ring. But with the regular patient bore (FOV) maintaining at 60-cm, the 65-cm detector ring is almost touching the patient, thus making the DOI blurring effect more severe in MR-PET, especially if PET resolution (detector-pixel size) is improved to 2-2.5 mm using our detector design. With the proposed technology, a lower-cost, practical MR-PET with DOI-localization can be realized to solve this severe problem in MR-PET. It is expected the median resolution of 5.5-mm within a 40 cm FOV in current MR-PET can be reduced to 2-2.5 mm.

SUMMARY

As explained in more detail below, exemplary embodiments of the present disclosure enable improvements in many aspects of optical emission detection as compared to current apparatus and methods.

Exemplary embodiments of the present disclosure address issues relating to the high-cost and low PET resolution of MR-PET. The high cost of PET-MR technology is due in part to MRI's high magnetic field that forbids the use of the traditional photomultiplier-tubes (PMT) in the PET scintillation detector system. Semiconductor photodetectors, due to their immunity to high magnetic fields, are typically the only practical photodetector that can be used in PET-MR (especially for simultaneous MR-PET imaging). Silicon photomultiplier (SiPM) has become the photodetector of choice for PET-MR due to its high gain and fast timing. However, using SiPM is costly because each SiPM is small (typically 3×3 mm² or less) thus needing many SiPM channels, plus each SiPM needs its own electronic read-out and amplifiers which can be more costly than the SiPM. For example, replacing one 38-mm PMT, commonly used in PET/CT would require 120-130 SiPM channels. In a PET/CT system with 500 PMT would need more than 50,000 SiPM plus the supporting electronics for each SiPM. The PMT would cost $75,000 in the PET, while the SiPM plus electronics would cost $300K-500K. To make MR-PET affordable, the SiPM-related cost in a clinical size PET-MR should be significantly reduced. Secondly, the proposed detector design can improve the PET detector size from current MR-PET's 4-5 mm to 2-mm, which would lead to more accurate tumor staging and improving neuro-PET studies that will be a major application of MR-PET due to the superb brain details in MR images. The current GE, Philips and Siemens MR-PET detector design using semiconductor photodetector (SiPM and Si-APD) are similar. In all GE, Siemens and Philips cases, the scintillation-detector decoding is achieved by having the entire scintillator-array surface nearly fully covered by SiPM or Si-APD. With this similar SiPM detector design, the GE/Siemens/Philips systems achieve detector-pixel size of 4 mm, resulting in the Siemens MR-PET resolution of 4.3 mm [23]. This commonality in current SiPM-based detectors uses a large number of SiPM/SiAPD channels and readout electronic, contributing to the high cost of MR-PET.

Furthermore, the large number of SiPM packed into a small array area requires much more compact sophisticated electronics. For example, the University of Valencia, Spain developed an 8×8 LYSO array using one scintillator pixel coupling to one SiPM. Such a design requires 64 channels readout electronics right behind the SiPM array (8×8), thus packing a 64 readout electronic channels in a small space of 25×25 mm² which would require a costly development of the special application-specific-integrated-circuits (ASIC) chips. Developing the ASIC chips is a large research project by itself. With the 8×8 detector matrix, one-to-one scintillator-SiPM coupling, and the LAL ASIC readout electronics, the University of Valencia group achieved 15% energy resolution (LYSO) [24]. Another example is a SiPM-based detector array from the Philips Research Europe showing another 100% footprint coupling between SiPM and scintillator array, using Philips own ASIC readout [25].

Current developments with SiPM-based PET detectors are based on nearly 100% footprint coverage of the scintillator array by SiPM arrays. Hence a major supplier of SiPMT, Hamamatsu Inc., has developed SiPM panels of difference sizes combining various numbers of SiPM on a panel for this 100%-SiPM-coverage practice [26]. Thus, this prevailing direction of SiPM-based PET-detector development will likely assure the high cost of MR-PET in the future.

Exemplary embodiments disclosed herein include a different approach in designing SiPM-based PET detectors. Instead of fully covering the entire scintillator array by SiPM, exemaplary embodiments enable ultrahigh resolution to be achieved by having the SiPM covering only the 4-corners of the scintillator array, thus covering a small fraction (e.g. 10%) of the scintillator array.

Exemplary embodiments of the present disclosure include an apparatus for optical emission detection, the apparatus comprising a block comprising scintillation crystals. In certain embodiments, the block comprises a first end and a second end parallel to the first end; the block comprises a plurality of sides extending between the first end and the second end; and the first end of the block comprises a first corner, a second corner, a third corner, and a fourth corner. In particular embodiments, the apparatus comprises reflective film coupled to the plurality of sides of the block and to the first end of the block; a first light sensor coupled to the block proximal to the first corner; a second light sensor coupled to the block proximal to the second corner; a third light sensor coupled to the block proximal to the third corner; and a fourth light sensor coupled to the block proximal to the fourth corner.

In specific embodiments, the block further comprises reflective film disposed between scintillation crystals. In some embodiments, the reflective film disposed between the scintillation crystals extends from the second end of the block toward the first end of the block. In certain embodiments, the reflective film disposed between the scintillation crystals comprises a plurality of sections with different lengths. In certain embodiments, the first, second, third, and fourth sensors are configured: to detect light reflected by the reflective film coupled to the plurality of sides of the block and to the first end of the block; and to detect light reflected by the reflecting disposed between scintillation crystals.

In particular embodiments, the reflective film coupled to the plurality of sides of the block substantially covers the plurality of sides of the block. In some embodiments, the reflective film coupled to the first end of the block comprises a first opening proximal to the first corner, a second opening proximal to the second corner, a third opening proximal to the third corner, and a fourth opening proximal to the fourth corner. In specific embodiments, the first sensor is coupled to the block at the first opening, the second sensor is coupled to the block at the second opening, the third sensor is coupled to the block at the third opening and the fourth sensor is coupled to the block at the fourth opening.

In certain embodiments, the scintillation crystals have a surface finish of approximately 4-20 micron $R_a$. In particular embodiments, 10 the first end of the block comprises a surface area; and the first, second, third, and fourth sensors cover less than twenty percent of the surface area of the first end. In some embodiments, the first, second, third, and fourth sensors cover less than ten percent of the surface area of the first end. In specific embodiments, the second end of the block comprises a fifth corner, a sixth corner, a seventh corner, and an eighth corner; and the apparatus further comprises a fifth light sensor coupled to the block proximal to the fifth corner, a sixth light sensor coupled to the block proximal to the sixth corner, seventh light sensor coupled to the block proximal to the seventh corner, and an eighth light sensor coupled to the block proximal to the eighth corner.

In certain embodiments, the block further comprises reflective film disposed between scintillation crystals; and the reflective film disposed between the scintillation crystals does not extend to the first or second end of the block. In particular embodiments, the reflective film disposed between the scintillation crystals comprises a plurality of sections with different lengths. In some embodiments, the reflective film disposed between the scintillation crystals comprises a plurality of sections with equal lengths. In specific embodiments, the reflective film coupled to the plurality of sides of the block substantially covers the plurality of sides of the block.

In certain embodiments, the first, second, third and fourth sensors are silicon photomultipliers. In particular embodiments, the apparatus is a component in a positron emission tomography detector.

Exemplary embodiments of the present disclosure include a method of detecting a location of a scintillating crystal in a block of scintillation crystals comprising a first end and a second end, where the method comprises: receiving light in the second end of the block of scintillation crystals; reflecting the light on reflective film disposed between a plurality of scintillation crystals in the block; reflecting the light on reflective film coupled to a plurality of sides and the first end of the block; and detecting the light by one of a plurality of sensors coupled to the first end of the block, wherein each of the plurality of sensors is coupled proximal to a corner of the first end of the block.

In certain embodiments of the method, the reflective film disposed between the plurality of scintillation crystals extends from the second end of the block toward the first end of the block. In particular embodiments of the method, the reflective film disposed between the plurality of scintillation crystals comprises a plurality of sections with different lengths. In some embodiments of the method, the reflective film disposed between the plurality of scintillation crystals comprises a plurality of sections with equal lengths. In specific embodiments of the method, the reflective film coupled to the plurality of sides of the block substantially covers the plurality of sides of the block.

In certain embodiments of the method, the reflective film coupled to the first end of the block comprises a first opening proximal to a first corner, a second opening proximal to a second corner, a third opening proximal to a third corner, and a fourth opening proximal to a fourth corner. In particular embodiments of the method, a first sensor is coupled to the block at the first opening, a second sensor is coupled to the block at the second opening, a third sensor is coupled to the block at the third opening and a fourth sensor is coupled to the block at the fourth opening. In some embodiments of the method, the scintillation crystals have a surface finish of approximately 4-20 micron $R_a$. In specific embodiments of the method, each of the scintillation crystals comprise a plurality of segments coupled together.

In certain embodiments of the method, the first end of the block comprises a surface area; and the plurality of sensors cover less than twenty percent of the surface area of the first end. In particular embodiments of the method, the plurality of sensors cover less than ten percent of the surface area of the first end.

In the following, the term "coupled" is defined as connected, although not necessarily directly, and not necessarily mechanically.

The use of the word "a" or "an" when used in conjunction with the term "comprising" in the claims and/or the specification may mean "one," but it is also consistent with the meaning of "one or more" or "at least one." The terms "about", "substantially" and "approximately" mean, in general, the stated value plus or minus 5%. The use of the term "or" in the claims is used to mean "and/or" unless explicitly indicated to refer to alternatives only or the alternative are mutually exclusive, although the disclosure supports a definition that refers to only alternatives and "and/or."

The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a method or device that "comprises," "has," "includes" or "contains" one or more steps or elements, possesses those one or more steps or elements, but is not limited to possessing only those one or more elements. Likewise, a step of a method or an element of a device that "comprises," "has," "includes" or "contains" one or more features, possesses those one or more features, but is not limited to possessing only those one or more features. Furthermore, a device or structure that is configured in a certain way is configured in at least that way, but may also be configured in ways that are not listed.

Other objects, features and advantages of the present invention will become apparent from the following detailed description. It should be understood, however, that the detailed description and the specific examples, while indicating specific embodiments of the invention, are given by way of illustration only, since various changes and modifications within the spirit and scope of the invention will be apparent to those skilled in the art from this detailed description.

DETAILED DESCRIPTION OF ILLUSTRATIVE EMBODIMENTS

Figure 1:
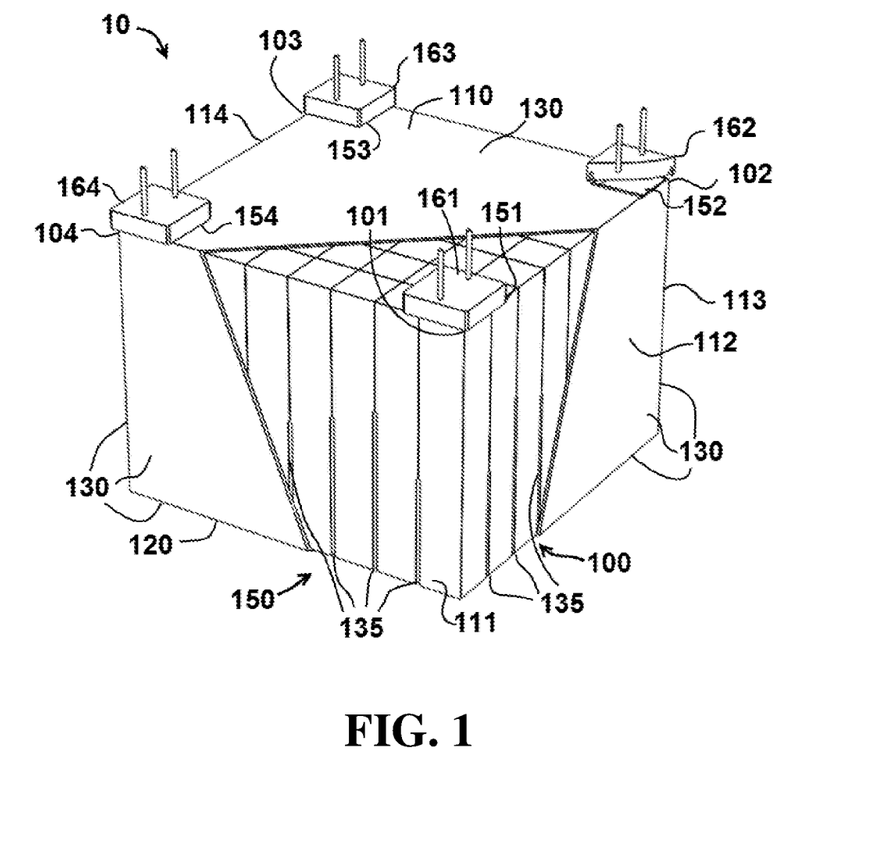
FIG. 1 displays a perspective view of an apparatus according to exemplary embodiments of the present disclosure.

Referring initially to FIG. 1, an apparatus 10 for optical emission detection comprises a block 100 comprising scintillation crystals 150. In the embodiment shown, block 100 comprises a first end 110 and a second end 120 parallel to first end 110. In addition, block 100 comprises a plurality of sides 111, 112, 113 and 114 extending between first end 110 and second end 120. First end 110 further comprises a first corner 101, a second corner 102, a third corner 103, and a fourth corner 104. The embodiment shown in FIG. 1 illustrates an 8×8 array of scintillation crystals, but it is understood that other embodiments may incorporate arrays of different sizes.

In the illustrated embodiment, apparatus 10 also comprises reflective film 130 coupled to sides 111, 112, 113 and 114 and to first end 110. In FIG. 1, reflective film 130 is shown in a partial cut-away view to allow scintillation crystals 150 and other interior features of block 100 to be visible. It is understood that in exemplary embodiments, reflecting 130 may substantially cover sides 111, 112, 113 and 114 and first end 110. Apparatus 10 further comprises reflective film 135 disposed between scintillation crystals 150 and extending from second end 120 toward first end 110. In the embodiment shown, reflective film 135 comprises a plurality of sections with the same or different lengths (e.g., different sections of reflective film 135 disposed between scintillation crystals 150 extend a different distance from second end 120 toward first end 110).

Apparatus 10 further comprises a first light sensor 161 coupled to block 100 proximal to first corner 101, a second light sensor 162 coupled to block 100 proximal to second corner 102, a third light sensor 163 coupled to block 100 proximal to third corner 103, and a fourth light sensor 164 coupled to block 100 proximal to fourth corner 104. It is understood that while the embodiment shown in FIG. 1 illustrates sensors 161-164 at the outermost corner locations of block 10, other embodiments may include sensors that are not located at the outermost corners. For example, in certain embodiments, sensors 161-164 may be located between one percent, five percent or ten percent closer to the center of block 100 (measured as a percentage of the distance from the center of block 100 to the respective corner proximal to the sensor). In exemplary embodiments, sensors 161-164 may be silicon photomultipliers (SiPM).

Also visible in apparatus 100, reflective film 130 comprises a plurality of openings 151, 152, 153 and 154, each proximal to corners 101, 102, 103 and 104, respectively. Sensors 161-164 are coupled to block 100 at openings 151-154 respectively. In FIG. 1, opening 151 is located within the partial cutaway section of reflective film 130 and sensor 162 is shown in a partial cut-away view so that opening 152 is visible. It is understood that openings 153 and 154 are located between sensors 163 and 164, respectively.

Apparatus 10 utilizes an orthogonal approach in designing SiPM-based PET detectors. As shown in the figures and described herein, instead of covering most of the entire scintillator array by SiPM, apparatus 10 incorporates a design that can enable ultrahigh resolution to be achieved by having the SiPM covering only areas proximal to the corners of the scintillator array, thus covering a small fraction (e.g. ten percent) of the scintillator array.

With the proposed four corner SiPM design with a ten percent scintillator-coverage, it is possible to decode even smaller scintillator pixels (higher spatial resolution) than typical current commercial MR-PET configurations that have one hundred percent scintillator-coverage. It is also possible to achieve a sixteen percent energy resolution, using low-cost single-channel readout electronics, which is similar to the University of Valencia 15% energy resolution using 64-channel ASIC readout electronics [24].

A typical 8×8 array with an SiPM coupled to each scintillator block would require 64 SiPM sensors. In contrast, the embodiment shown in FIG. 1 reduces the number of 64 SiPM to just 4 SiPM, and simplifies the readout electronics from 64-channel ASIC readout electronics to just four channel readout electronics without needing to develop costly special ASIC integrated circuits. The simplified electronics and much fewer SiPM usage (from 64 to 4 is a 94% reduction) also significantly reduce heat dissipation and the demanding cooling requirement of the MR-PET system (SiPM performance and stability is very sensitive to heat and temperature).

The ultrahigh-resolution and the low-cost objectives can be achieved by using an analog-decoding approach as shown in FIG. 1. The analog approach greatly reduces the SiPM footprint relative to the scintillator-array footprint (e.g. surface area of one end of the array), thereby achieving the substantial cost saving. The scintillation light from the scintillator array is optimized internally to be distributed to just four small corner-exit ports in the scintillator array. At each corner exit port, there is a small SiPM ($3\times3$ mm$^{2)}$, and the combined footprint of the 4 exit-port SiPM is much smaller than the footprint of the scintillation array ($20\times20$ mm$^{2)}$. The fraction of the scintillator-array footprint not covered by SiPM is the fraction of SiPM cost saving. For a $20\times20$ mm$^2$ scintillator array coupling to just four $3\times3$ mm$^2$ SiPM at the 4-corner of the array, the footprint reduction would be $1-(3\times3\times4)/(20\times20)$ or 91%, thereby providing a 91% cost reduction in SiPM and readout electronics.

This would reduce the cost of the PET section of PET-MR to be close to or even below that of PET-CT. This low cost also achieve higher PET resolution of 2.5-3.0 mm (for whole-body MR-PET) or 1-2 mm for brain MR-PET compared to the 4-5 mm in current MR-PET.

Figure 2:
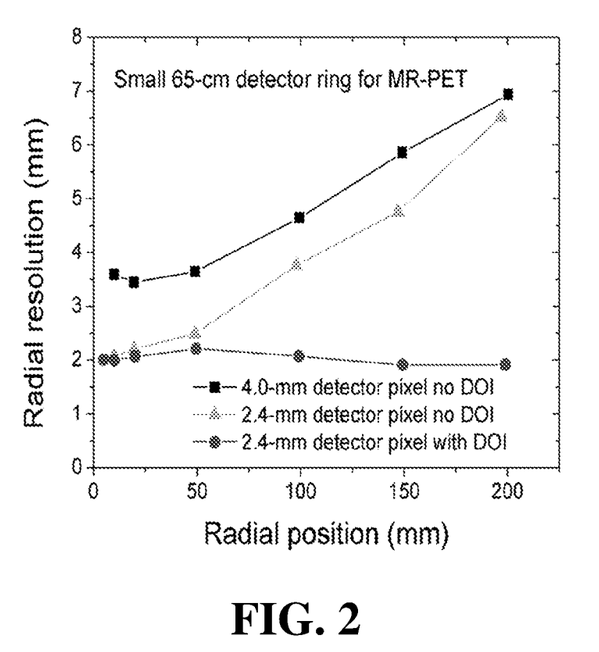
FIG. 2 displays a Monte Carlo simulation of a PET detector ring comprising the apparatus of FIG. 1.

Even with the addition of DOI-capability, the SiPM cost for embodiments disclosed herein will still only be 20% of current MR-PET systems that have no DOI capability. The DOI blurring in MR-PET is more severe than PET-CT due to the much smaller PET-detector diameter of 65-cm inside the MR system as shown in FIG. 2. FIG. 2 illustrates a Monte Carlo simulation of a small 65 cm PET detector ring. The 4 mm detector pixel resolution degrades from 3.5-mm at center to 7-mm at position of 200 mm (patient torso). The 2.4-mm detector has its resolution degrades from 2 mm to 6.5 mm.

Shao and Cherry have shown that 2-mm LSO detectors with DOI localization achieved 3.5-mm DOI resolution [41]. The Monte Carlo simulation (GEANT4) shows that with such a DOI resolution on 2.4-mm detector pixel, the resolution in the whole FOV can be improved substantially (FIG. 2 line with circles) from a median resolution of 5.5-mm (for the current MR-PET 4-mm detector) to a median resolution of 2 mm (for proposed 2.4-mm detectors). The proposed scalable detector can be used to create affordable DOI-measuring detectors, thereby potentially leading the innovative DOI PET technology into the clinical arena and solving DOI-blurring in PET especially for MR-PET systems.

The proposed analog-decoding approach is orthogonal to the current prevailing SiPM PET-detector designs covering most of the scintillator array by SiPM with a one-to-one readout. One innovative feature that enables this proposed low-cost ultrahigh-resolution detector to work is the design of the internal light-distribution system that guides the scintillation light to the four small exit ports while maintaining good energy resolution.

Figure 3:
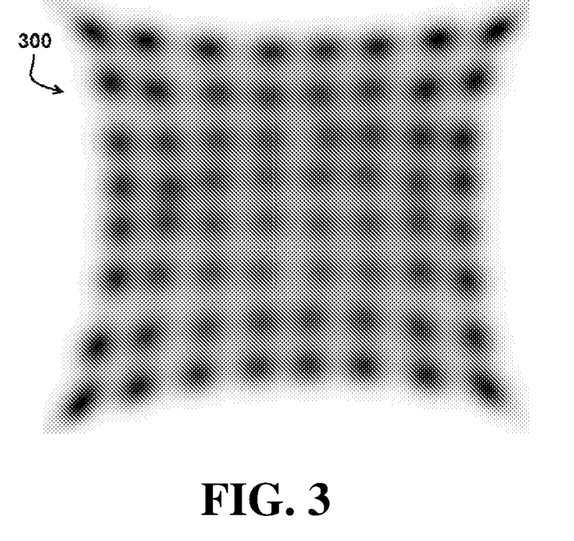
FIG. 3 displays an array decoding map of scintillating crystals of the apparatus of FIG. 1.

Results obtained from exemplary embodiments such as apparatus 100 are shown in FIGS. 3-6. FIG. 3 represents an 8×8 LYSO array decoding map 300, using 4-corner exit-ports for scintillation light detection ($3\times3$ mm2/port) and an analog-decoding reflecting-film network inside array as shown and described above in FIG. 1. FIG. 3 is the crystal decoding result of an experiment 8×8 block; four 18-mm diameter photomultiplier tubes (PMT) was used as a substitute to simulate four $3\times3$ mm$^2$ SiPM by covering the 18-mm round PMT by mirror film with an opening (cut-out) of $3\times3$ mm$^2$. The target spatial resolution (scintillator pixel size) is set to be 2.4-mm, which is much smaller (higher spatial resolution) than the 4-6 mm pixels used in the current human MR-PET under development by Siemens/GE/Philips and others. Secondly, an 8×8 scintillator array matrix is selected so that the assembled scintillator array size is $20\times20$ mm$^2$. Thirdly, the $3\times3$ mm$^2$ exit-port size is selected at the 4-corners of the 8×8 scintillator array, which would accommodate the $3\times3$ mm$^2$ SiPM available from several manufacturers. As discussed earlier, with these dimensions, a 91% saving can be achieved in the amount of SiPM and readout electronics used. The exit-port footprint is only 9% of the scintillator-array footprint.

FIG. 2 illustrates a Monte Carlo simulation of a small 65 cm diameter PET detector ring. The 4 mm detector pixel degrades the image resolution from 3.5-mm at center to 7-mm at the position of 200 mm (patient torso). The 2.4-mm detector has its resolution degrades from 2 mm to 6.5 mm.

Decoding map 300 shown in FIG. 3 was produced using a LYSO scintillator array (8×8) constructed with 64 LYSO pixels (2.4×2.4×15 mm3) closely packed together. Instead of having polished surfaces as the typical PET detectors, the surfaces of the detector pixels were prepared to a 4-micron $R_a$ finish (ground-glass finish) by a lapping process. Between adjacent crystals, a thin reflecting mirror film (0.06 mm thin) was placed, with each reflective film had a different shape/size depending on the location of the crystals and the orientation of the particular crystal surface. All together, 112 thin film reflectors were placed inside the array, with 32 different types of shapes inside this 64 crystal array. The 32 different shaped provide 32 degrees of freedom in controlling light distribution from the scintillation source to the 4-exit ports. The analog decoding map of the LYSO scintillator array is shown in FIG. 3, showing all 64 crystals are clearly decoded.

Figure 4:
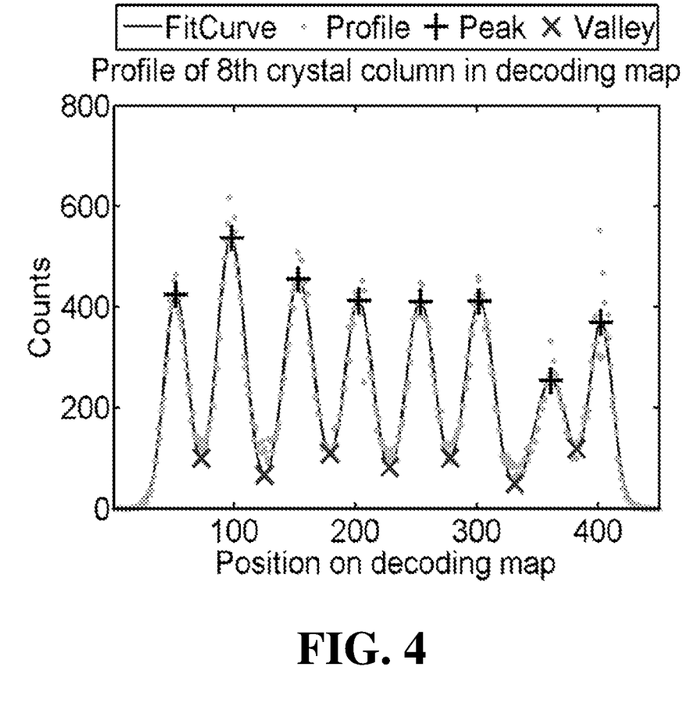
FIG. 4 displays a graph of a decoding-profile cut for a column of scintillating crystals of FIG. 3.

FIG. 4 illustrates the decoding-profile cut for a column of scintillators in FIG. 3, showing good crystal-decoding delineation. Hence, it is demonstrated that the detector design can resolve 2.4×2.4 mm$^2$ crystal pixel size (comparing to the current 4-6 mm in commercial MR-PET), while using only 9% of the SiPM and readout electronics of the current commercial MR-PET systems that covers 100% of the scintillator-array footprint with SiPM.

Figure 5:
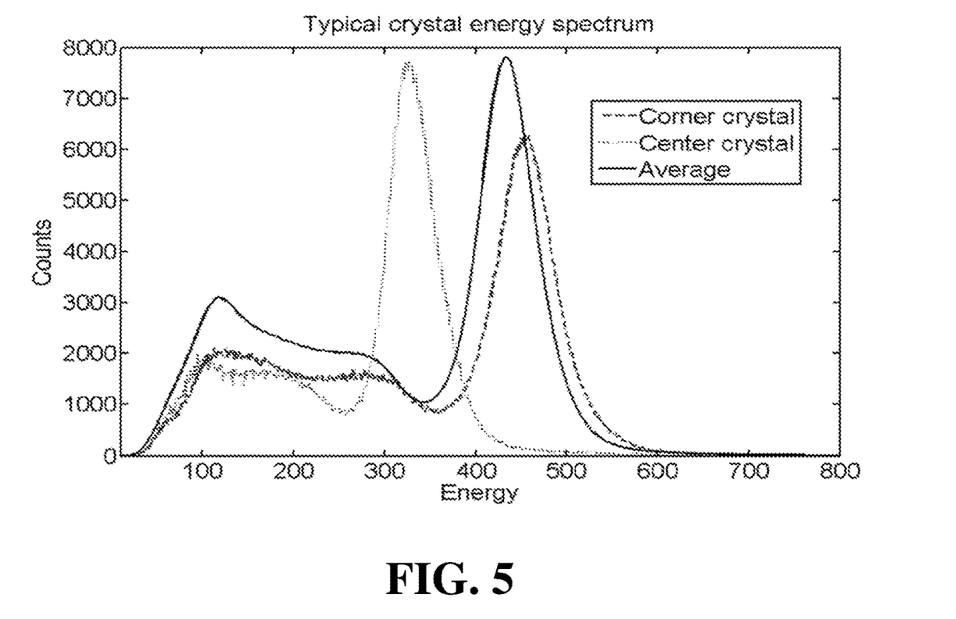
FIG. 5 displays a graph of representative energy signal pulse height spectra of scintillating crystals of FIG. 3.

The average energy resolution for this LYSO array is 16% (range of 13% to 18%). The representative energy signal pulse height spectra are shown in FIG. 5, where the energy pulse-height spectra of a central crystal (farthest away from the 4 corner exit ports) and the corner crystal (right at the exit port) are shown. The light collection efficiency of the central crystal (worse-case location) shown relative to the corner crystal (best-case) is 70%, which is better than the traditional commercial PET block-detector design of 35% [27]. This good light-output uniformity demonstrates the effectiveness of the internal light-distribution system of exemplary embodiments disclosed herein.

With the 4-corner exit-port design with a 9% footprint-coverage coupling, using reflecting-film system inside the scintillator array, an average energy resolution of 16% can be achieved using low-cost single-channel readout electronics. This 16% energy resolution is comparable to that of the 8×8 array SiPM detector developed by the University of Valencia achieving 15% energy resolution using a costly 64-channel ASIC readout electronics and a near 100% scintillator coverage by SiPM [24]. Hence, the proposed design reduces the use of 64 SiPM to just 4 SiPM, and simplifies the readout electronics from 64-channel ASIC readout electronics to just 4 simple single-channel readout electronics without needing to develop costly special ASIC integrated circuits. Heat from electronics is also substantially reduced with the proposed 4-corner decoding design.

Figure 6:
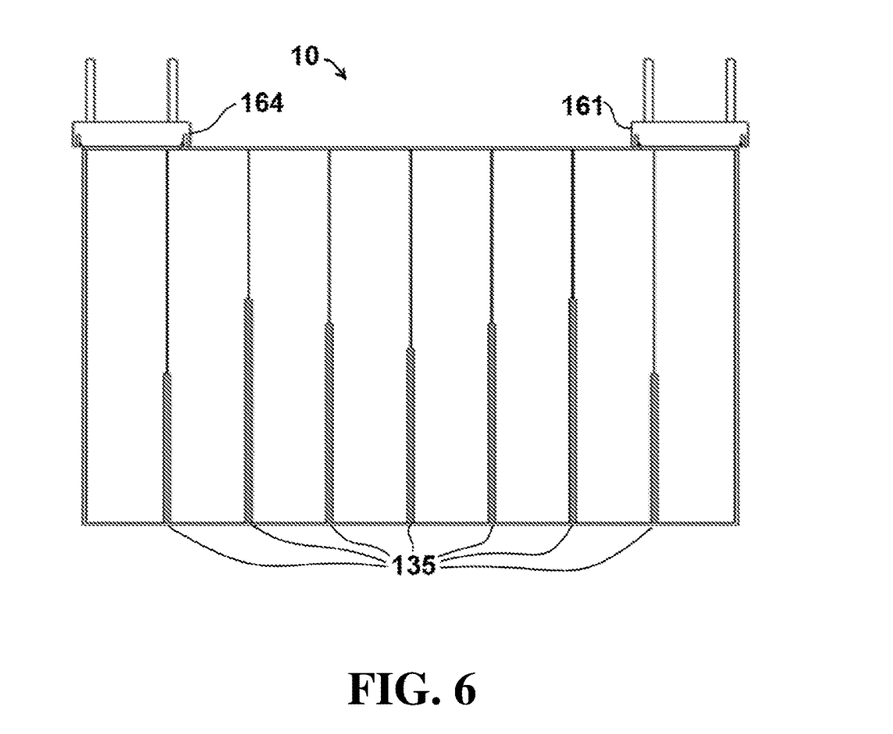
FIG. 6 displays a section view showing reflective films in the scintillator apparatus of FIG. 1.

FIG. 6 illustrates the shape and sizes of one row of reflective films 135 used in the scintillator array shown previously in FIG. 1. The shapes and sizes of the reflector films can be modified to maximize the crystal-decoding delineation and output uniformity of the crystals. The results from this study demonstrate that the proposed design can provide superior spatial resolution in the PET section of MR-PET and at the same time significantly reduces the cost. The optimal shape-and-size set of the internal reflectors is not unique because of the large degrees of freedoms (e.g., there are 32 different reflector shapes in a 8×8 crystal array). There can be multiple sets with different reflector geometries that can produce "usable" crystal decoding. Secondly, the reflector size and shape differences can also be different depending on how the system designer choose to prioritize the different detector performance criteria (spatial resolution, energy resolution, signal uniformity, etc). Thirdly, there are manufacturing considerations that can change the reflector sizes and shapes. For example, a large piece of transparent glass can be placed on the array surface 110 and/or 120 between the crystals and the photo-sensors, acting as light guide to spread the light before reaching the photo-sensor, the reflector sizes and shapes can change. Again, if the thickness of that piece of glass (light guide) is changed, the reflector sizes and shapes will also change.

If the crystal-pixel size is increased from 2.4×2.4 mm$^2$ to 4×4 mm$^2$ (e.g. as used in the Siemens MR-PET system), the larger cross-section of the detector pixel would increase the light output and could allow one to decode more than an 8×8 scintillator matrix. Hence, LYSO array footprint would increase to 32×32 mm$^2$ giving a SiPM footprint ratio of just 3.6% relative to the scintillator footprint, thus reducing the SiPM cost to just 3.6%, with a saving of 96.4%. This shows that the target spatial resolution determines the level of cost reduction. Similarly, if the crystal size is decreased from 2.4×2.4 mm$^2$ to 1.2×1.2 mm$^2$, the scintillator array footprint may be decreased to 10×10 mm$^2$. Hence, the SiPM footprint may be 36% of the scintillator footprint resulting in reducing SiPM usage by 64% that is still a significant reduction in production cost.

These examples indicate that the proposed design is geometrically scalable and flexible. Using the same 3×3 mm$^2$ SiPM, the same readout electronics and the same data-acquisition channel, one can create MR-compatible PET detectors ranging from preclinical systems (1.2 mm detector-pixel resolution) to whole-body human clinical systems using the same basic readout-electronics building block. Potentially, the proposed design would enable the production of preclinical MR-PET system with a 64% reduction in SiPM cost, and for the less-resolution-demanding human whole body MR-PET, a >90% reduction in SiPM and front-end electronic usage is possible.

The analog-decoding approach in making MR-PET detectors described herein would significantly reduce the cost of MR-PET systems across the board from small animal imaging to large human system, making MR-PET systems much more affordable and with higher imaging resolution than the current SiPM-detector approach.

Certain embodiments may also utilize corner SiPM analog-decoding to provide depth-of-interaction PET detectors. Such embodiments can provide practical, low-cost, depth-of-interaction-localizing detectors using the proposed SiPM analog-decoding design. This design can reduce DOI resolution-blurring artifacts for regions away from the center, which is more severe for MR-PET due to its smaller PET detector ring that is necessary to be able to fit inside the bore (60-70 cm) of an MRI imaging system. Resolution degradation due to the depth-of-interaction effect (DOI) in the thick PET detectors has been studied for 30 years (especially in the last 10 years) using solid-state SiPM and Si-APD devices, but these solutions have not been translated into the large clinical systems. Again, this is due to the high-cost of SiPM implementation, because measuring the depth of interaction in the thick scintillator crystal, SiPM are required on both ends of the scintillator array, which doubles the amount (cost) of SiPM used. Given the already high cost of an MR-PET without DOI correction, an MR-PET with DOI correction would not be affordable or practical. However, paradoxically for MR-PET, DOI detection is greatly needed, especially for the ultrahigh-resolution detector proposed here, due to more severe DOI blurring from the smaller PET detector ring inside the confined space of an MRI.

Since the proposed detector design may reduce the SiPM usage by 10 times or more, adding DOI readout (doubling of SiPM usage) would still reduce SiPM usage by 5 times comparing to current MR-PET without DOI capability. Hence, the proposed DOI detector design would be a more practical and affordable solution to resolve the DOI blurring problem for PET-CT and MR-PET. DOI effect is even more severe in small detector ring system such as preclinical animal-model systems, and brain systems. DOI-detectors will also allow whole-body PET-CT to reduce its detector ring diameter from the current 85-cm diameter to 65-cm that would reduce the volume of the expensive scintillator (LYSO/LSO) used by 24%, while increase the system detection sensitivity by 85/65=31%. Hence, implementing DOI-detectors is highly beneficial for both PET-CT and MR-PET.

Figure 7:
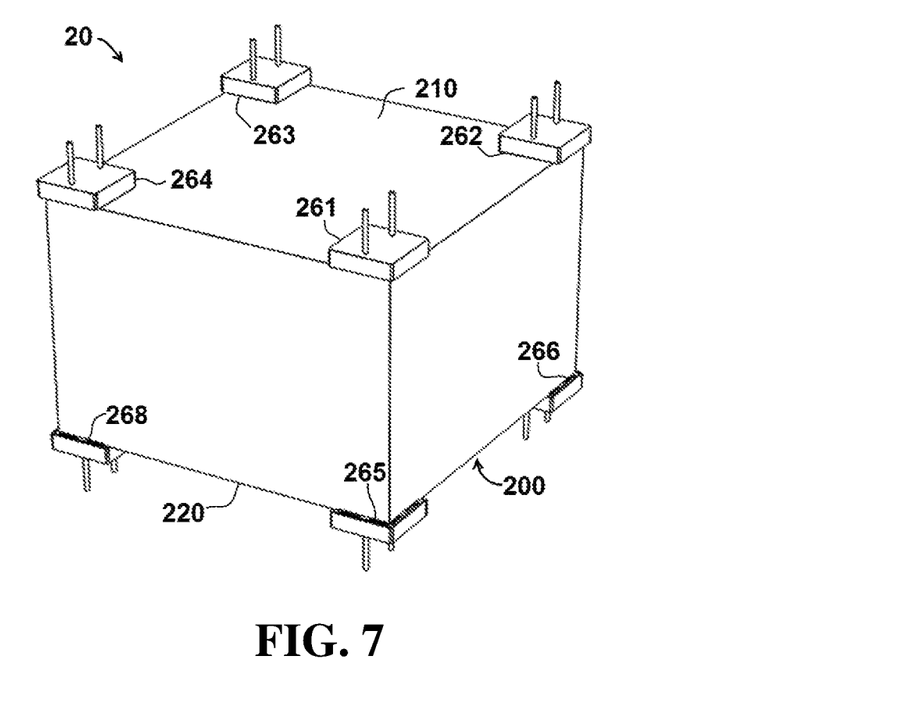
FIG. 7 displays a perspective view of an apparatus according to exemplary embodiments of the present disclosure.
Figure 8:
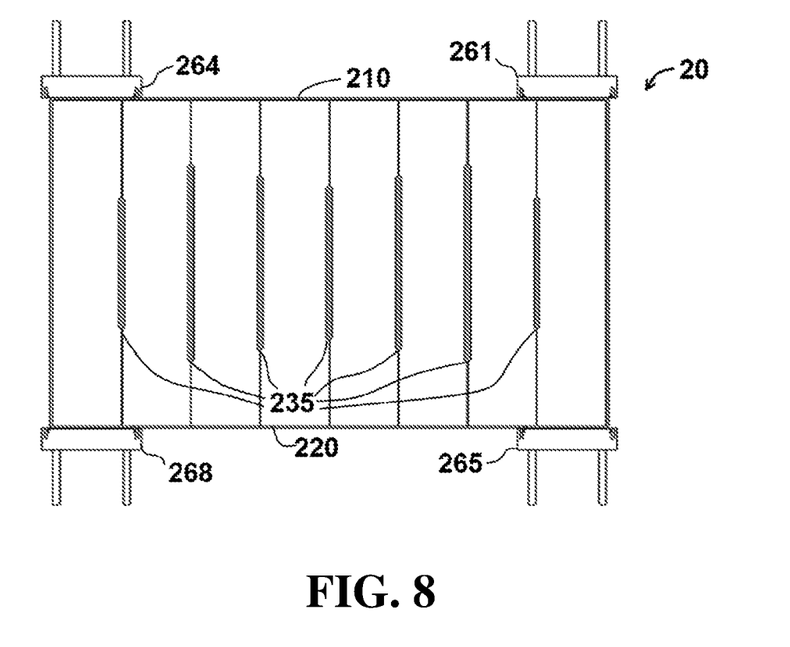
FIG. 8 displays a section view showing reflective films in the scintillator apparatus of FIG. 7.

Exemplary embodiments may comprise a dual end SiPM readout as shown in FIGS. 7-8. The embodiment shown in FIGS. 7-8 is similar to that disclosed in FIG. 1, but includes additional features. Features shown in FIGS. 7-8 that are equivalent to those of FIG. 1 are labeled with similar reference numbers that begin with the numeral "2" instead of "1". To avoid redundancy, labeling and description of all equivalent features will not be repeated, and the previous description of such features in the discussion of FIG. 1 is incorporated herein by reference.

Apparatus 20 shown in FIGS. 7-8 comprises additional openings in the reflective film and sensors 265-268 coupled to the scintillator block 200 at opposing ends 210 and 220 (e.g. the patient end and the distal end). Sensor 267 is not visible in the perspective and section views shown in FIGS. 7-8 but is located in the corner opposing sensor 263. In order to equalize the light output distributed to both ends of the scintillator array in this dual-end readout geometry, the reflective film shapes and/or sizes can be modified from a shape that biases to one-end (for the single-end readout in FIG. 6) to a symmetrical shape as shown in reflective film 235 of FIG. 8.

Determining DOI using dual-end readout has been widely published and well understood, [28-30]. In general, the DOI information is determined by the centroid of signal-difference between the front SiPM and the back SiPM attached to two ends of a long scintillator pixel. Using LYSO/LSO scintillators with 1-1.5 mm pixel width and 10-mm thickness, the DOI resolution with dual-end readout is about 1-mm [31]. Using 20-mm thick detector, the DOI resolution with dual-end readout is 3.5 mm [32]. The Monte Carlo simulation (GEANT4) shows even with 3.5-mm DOI resolution as in [32], the entire FOV (40-cm) can achieve 2-mm resolution with 2-2.5 mm scintillator pixels used in the study (see FIG. 2). This is significantly better than the median resolution of 5.5-mm using non-DOI 4-mm scintillator pixels in current non-DOI MR-PET. In the proposed analog-decoding detector with 4-corner SiPM on both ends, the four SiPM signals on each end are summed first and the DOI centroid of the detected event is determined by the difference of the front-sum signal and back-sum signal: (F=front, B=back, V=signal, see FIG. 8):

$$DOI=(V_{Fa}+V_{Fb}+V_{Fc}+V_{Fd})-(V_{Ba}+V_{Bb}+V_{Bc}+V_{Bd}))$$

And the X-Y scintillator matrix decoding is determined by:

$$\text{pixel } X \text{ position}=\{[(V_{Fa}+V_{Ba})+(V_{Fb}+V_{Bb})]-[(V_{Fc}+V_{Bc})+(V_{Fd}+V_{Bd})]\}/\Sigma_{ij}V_{ij}$$

$$\text{pixel } Y \text{ position}=\{[(V_{Fa}+V_{Ba})+(V_{Fd}+V_{Bd})]-[(V_{Fb}+V_{Bb})+(V_{Fc}+V_{Bc})]\}/\Sigma_{ij}V_{ij}$$

To improve the DOI resolution, the four cylindrical surfaces of the crystal needles can be ground or lapped to a certain rough finished depending on (a) the thickness, (b) the cross-section dimensions of the crystal needles, and (c) the compromise between energy resolution and spatial resolution. Using rough-finish to improve DOI resolution has been reported by others (Cherry, S., et al, and Shao, Y., et al [28, 32]) Another crystal treatment used by others (Yamaya, et. al) to improve DOI resolution is to segment the crystal needle length (thickness) into several segments and the segments are glued back to restore the original length. Both of the above crystal treatments can be incorporated in the current invention. In addition, a thin layer of glass can cover each of the crystal surfaces 210 and 220 to function as a diffusion light guide.

Methods of Manufacturing

The high resolution and the significant cost-reduction of the proposed analog-decoding SiPM PET detector are enabled by the maze-like network of internal reflective film inside the scintillator array. For an N×N scintillator array, this reflector maze will have (N−1)× (2N) pieces of films with 4N types of shapes/sizes. For a 10×10 array, there are 180 pieces of film bearing 40 different shapes/sizes attached to the 100 scintillator pixels within the array. Gluing 180 tiny thin films with 1-2 mm width in 40 different shapes onto 100 crystals with high precision to make one small array is tedious; it took our experienced detector research staff 4 days to painstakingly make one detector array in our preliminary study for each experimental trial. There are typically 1,000-2,000 arrays in a whole-body MR-PET. Hence, for the proposed design to be practical, the existence of an efficient production method is vital and needs to be demonstrated and tested.

Exemplary embodiments include a slab-sandwich-and-slice (SSS) production method for making analog-decoding detector arrays with reflecting-film structures to precisely distribute the desirable amount of scintillation light to the photo-sensors coupling to the array [33-35]. The assemblers do not need to handle the tiny scintillation detector needles/pixels, but handle much larger scintillator slabs (e.g., 20-30 detector pixel in width). This high-precision and efficient-production method has been demonstrated in making a breast PEM system [36], an ultrahigh-resolution preclinical PET-CT system with 32,000 scintillation detectors with sub-mm image resolution [1], and ultrahigh-resolution whole-body PET with 2.8-3.0 mm resolution [37-38].

Exemplary embodiments may adopt the SSS production method for the mass production of the proposed 4-corner SiPM PET detector, both the non-DOI version and the DOI version. For the non-DOI version, the SSS adoption is similar the previously described embodiment, except for the shape/size of the reflective film panels. For the DOI version, the adoption is to provide for the symmetric readout between the front SiPM and the back SiPM, which can be achieved by moving the reflective film in FIGS. 6 and 8 to the central region of the slabs and slices.

Method of Equalizing Amplification Gain of Solid-state Photosensors Coupled to Block Solid-state photosensors amplification gain varies significantly between different photosensors. The gain is very sensitive to temperature, and the gain changes as a function of temperature also varies between different photosensors. Hence, to achieve optimal analog decoding, the amplification gain for the solid-state photosensors coupled to the scintillation detector block should be equalized by electronic means, such as by a variable-gain amplifier connecting to the output of each photosensor or by different biasing voltage to each photosensor. The equalization for each photosensor can be determined by the signal output level of each photosensor from the signal of a common light emitting diode (LED) placed at the center of the detector-block readout surface that the photosensor are coupled to or at the opposite surface. This method can be used to tune the four photosensors in a non-depth-of-interaction detector design or the eight photosensors in a detector with depth-of-interaction (2-sided readout) design The LED can be used as is by shining its light through a center hole in the reflective film covering the readout surface or through an optical fiber going to this center hole. The optical fiber can also go into the centroid region of the block through a hole inside the crystal block. For the DOI invention, two light-output-matching LED can each be placed at the center of the opposite surfaces 210, 220 for calibration and setting the gain of each of the amplifiers connecting to each SiPM. Since there is a large free central area on the readout surface of the block (the photosensors only occupy the small corners of the readout surface), there is sufficient space to install the LED tuning fixture. In fact, the LED (with its control electronics) and 4 photosensors can be mounted on the same circuit board connect to the readout surface.

The LED can be pulsed to produce the light for equalization before an imaging session or even during an imaging session (real-time tuning). Software can be used to control the proper LED pulsing (frequency and/or amplitude) and to derive the appropriate equalization.

It is understood that the use of directional or geometric nomenclature (including for example, terms such as "row" and "column") is not intended to indicate any specific orientation for a particular dimension or axis. In addition, any reference to directions such as "top", "bottom", "left", "right", "front" or "back" is used for sake of convenience when referring to the figures disclosed herein, and is not intended to denote a particular location or orientation for all exemplary embodiments.

* * *

All of the devices, apparatus, systems and/or methods disclosed and claimed herein can be made and executed without undue experimentation in light of the present disclosure. While the devices, apparatus, systems and methods of this invention have been described in terms of particular embodiments, it will be apparent to those of skill in the art that variations may be applied to the devices, apparatus, systems and/or methods in the steps or in the sequence of steps of the method described herein without departing from the concept, spirit and scope of the invention. All such similar substitutes and modifications apparent to those skilled in the art are deemed to be within the spirit, scope and concept of the invention as defined by the appended claims.

REFERENCES

The contents of the following references are incorporated by reference herein:
1. U.S. Pat. No. 7,238,946
2. U.S. Pat. No. 7,291,841
3. U.S. Pat. No. 7,626,389
4. U.S. Pat. No. 7,671,339
5. U.S. Pat. No. 8,115,174
6. U.S. Pat. No. 8,384,040
7. U.S. Pat. No. 8,405,038
8. U.S. Pat. No. 8,809,790
9. U.S. Pat. No. 8,946,643
10. U.S. Pat. No. 8,963,093
12. U.S. Pat. Publ. 2005/0253073
13. U.S. Pat. Publ. 2007/0096031
14. U.S. Pat. Publ. 2011/0192982
15. U.S. Pat. Publ. 2012/0307025
16. U.S. Pat. Publ. 2013/0028379
17. U.S. Pat. Publ. 2013/0009067
18. U.S. Pat. Publ. 2013/0153774
19. U.S. Pat. Publ. 2014/0264041
20. U.S. Pat. Publ. 2014/0110592
21. PCT Pat. Publ. WO2013166574
22. PCT Pat. Publ. WO2014181232
23. Gaspar Delso, Sebastian Furst, Bjorn Jakoby, Ralf Ladebeck, Carl Ganter, Stephan G. Nekolla, Markus Schwaiger, and Sibylle Ziegler: Performance Measurements of the Siemens mMR Integrated Whole-Body PET/MR Scanner. J Nucl Med 2011; 52: No. 12, 1-9.
24. Gabriela Llosá, Pierre Barrillon, John Barrio, et al: High performance detector head for PET and PET/MR with continuous crystals and SiPMs. Conference Record, PSMR2012 Conference, Elba, Italy, May 26-31, 2012.
25. Piemonte C, Ferri A, Gola A, Tarolli A, Berneking A, Schulz V: First results on Sensitivity Encoded Silicon Photomultipliers. PSMR workshop, Isola D'Elba, 26-29 Apr. 2012.
26. 40. Schaart D. R., Borghi G., van Dam H T., van der Lei G J, Seifert S, Tabacchini V: Digital SiPM based monolithic scintillator detectors for high-resolution, time-of-flight PET/MRI, PSMR workshop, Isola D'Elba, 26-29 Apr. 2012.
27. Tornai M., Germano, M., Hoffman E. J., Position and energy response of PET block detectors with different light sharing schemes. IEEE Trans. Nucl. Sci., vol 41, no. 4, pp. 1458-1463, August 1994.
28. Yang Y, Qi J, Wu Y, St James S, Farrell R, Dokhale P A, Shah K S, Cherry S R: Depth of interaction calibration for PET detectors with dual-ended readout by PSAPDs. Phys Med Biol. 2009 Jan. 21; 54(2):433-45. Epub 2008 Dec. 19.
29. Kent C. Burr, Adrian Ivan, Member, IEEE, Donald E. Castleberry, James W. LeBlanc, Member, IEEE, Kanai S. Shah and Richard Farrell: Evaluation of a Prototype Small-Animal PET Detector With Depth-of-Interaction Encoding. IEEE Transactions on Nuclear Sciences, VOL. 51, NO. 4, AUGUST 2004.
30. W. W. Moses and S. E. Derenzo: Design studies for a pet detector module using a pin photodiode to measure depth of interaction. IEEE Transactions on Nuclear Science NS-41, pp. 1441-1445 (1994).
31. Cosentino L: New developments at INFN-LNS on ToF-DoI PET based on SiPM detectors, PSMR workshop, Isola D'Elba, 26-29 Apr. 2012.
32. Shao Y, Meadors K, Silverman, R, Farrell R, Cirignano L, Grazioso R, Shah K S, and Cherry S R: Dual APD Array Readout of LSO Crystals: Optimization of Crystal Surface Treatment, IEEE Transaction s on Nuclear Science, Vol. 49, No. 3, June 2002, 649
33. Uribe, J, Wong, W-H, Baghaei, H, Farrell, R, Li, H, Aykac, M, Bilgen, D, Liu, Y, Wang, Y, Xing, T. An Efficient Detector Production Method For Position-Sensitive Scintillation Detector Arrays with 98% Detector Packing Fraction. IEEE Transactions on Nuclear Science 50(5):1469-1467, October 2003.
34. Ramirez R A, Liu S, Liu J, Zhang Y, Kim S, Baghaei H, Li H, Wang Y, Wong W H. High-resolution L(Y)SO Detectors Using PMT-Quadrant-sharing for Human and Animal PET Cameras. Nuclear Science, IEEE Transactions on 55(3):862-869, http://ieeexplore.ieee.org, June 2008. PMCID: PMC2783601.

35. Ramirez R, An S, Liu S, Zhang Y, Li H, Baghaei H, Wang C, Wong W-H. Ultra-high Resolution LYSO PQS-SSS Heptahedron Blocks for Low-cost MuPET. IEEE Trans on Nucl Sci 58(3):626-633, IEEE.com, June 2011.
36. Ramirez R A, Zhang Y, Liu S, Li H, Baghaei H, An S, Wang C, Jan M L, Wong W H. A Lower-cost High Resolution LYSO Detector Development for Positron Emission Mammography (PEM). Nuclear Science, IEEE Transactions on 56(5):2621-2627, http://ieeexplore.ieee-.org, October 2009. PMCID: PMC2872500.
37. H. Li, Y. Zhang, H. Baghaei, R. A. Ramirez-Jaramillo, W.-H. Wong: A Lower-Cost Higher-Resolution PET Camera Development and Feasibility Verification. IEEE Nuclear Science Symposium and Medical Imaging Conference, Los Angeles, Oct. 29, 2012.
38. Li H, Wong W-H, Baghaei H, Uribe J, Wang Y, Zhang Y, Kim S, Ramirez R, Liu J, Liu S. The Engineering and Initial Results of a Transformable Low-cost High-resolution PET Camera. IEEE Transactions on Nuclear Science 54(5):1583-1588, October 2007.

The invention claimed is:

1. An apparatus for optical emission detection, the apparatus comprising:
    a block comprising scintillation crystals, wherein:
        the block comprises a first end and a second end parallel to the first end;
        the block comprises a plurality of sides extending between the first end and the second end; and
        the first end of the block comprises a first corner, a second corner, a third corner, and a fourth corner;
    reflective film coupled to the plurality of sides of the block and to the first end of the block;
    a first light sensor coupled to the block proximal to the first corner;
    a second light sensor coupled to the block proximal to the second corner;
    a third light sensor coupled to the block proximal to the third corner; and
    a fourth light sensor coupled to the block proximal to the fourth corner, wherein the reflective film coupled to the first end of the block comprises a first opening proximal to the first corner, a second opening proximal to the second corner, a third opening proximal to the third corner, and a fourth opening proximal to the fourth corner.

2. The apparatus of claim 1 wherein the block further comprises reflective film disposed between scintillation crystals.

3. The apparatus of claim 2 wherein the reflective film disposed between the scintillation crystals extends from the second end of the block toward the first end of the block.

4. The apparatus of claim 2 wherein the reflective film disposed between the scintillation crystals comprises a plurality of sections with different lengths.

5. The apparatus of claim 2 wherein the first, second, third, and fourth sensors are configured:
    to detect light reflected by the reflective film coupled to the plurality of sides of the block and to the first end of the block; and
    to detect light reflected by the reflecting disposed between scintillation crystals.

6. The apparatus of claim 1 wherein the reflective film coupled to the plurality of sides of the block substantially covers the plurality of sides of the block.

7. The apparatus of claim 1 wherein the first sensor is coupled to the block at the first opening, the second sensor is coupled to the block at the second opening, the third sensor is coupled to the block at the third opening and the fourth sensor is coupled to the block at the fourth opening.

8. The apparatus of claim 1 wherein the scintillation crystals have a surface finish of approximately 4-20 micron $R_a$.

9. The apparatus of claim 1 wherein:
    the first end of the block comprises a surface area; and
    the first, second, third, and fourth sensors cover less than twenty percent of the surface area of the first end.

10. The apparatus of claim 9 wherein the first, second, third, and fourth sensors cover less than ten percent of the surface area of the first end.

11. The apparatus of claim 1 wherein:
    the second end of the block comprises a fifth corner, a sixth corner, a seventh corner, and an eighth corner; and
    the apparatus further comprises a fifth light sensor coupled to the block proximal to the fifth corner, a sixth light sensor coupled to the block proximal to the sixth corner, seventh light sensor coupled to the block proximal to the seventh corner, and an eighth light sensor coupled to the block proximal to the eighth corner.

12. The apparatus of claim 11 wherein:
    the block further comprises reflective film disposed between scintillation crystals; and
    the reflective film disposed between the scintillation crystals does not extend to the first or second end of the block.

13. The apparatus of claim 12 wherein the reflective film disposed between the scintillation crystals comprises a plurality of sections with different lengths.

14. The apparatus of claim 12 wherein the reflective film disposed between the scintillation crystals comprises a plurality of sections with equal lengths.

15. The apparatus of claim 11 wherein the reflective film coupled to the plurality of sides of the block substantially covers the plurality of sides of the block.

16. The apparatus of claim 1 wherein the first, second, third and fourth sensors are silicon photomultipliers.

17. The apparatus of claim 1 wherein the apparatus is a component in a positron emission tomography detector.

18. A method of detecting a location of a scintillating crystal in a block of scintillation crystals comprising a first end and a second end, the method comprising:
    receiving light in the second end of the block of scintillation crystals;
    reflecting the light on reflective film disposed between a plurality of scintillation crystals in the block;
    reflecting the light on reflective film coupled to a plurality of sides and the first end of the block; and
    detecting the light by one of a plurality of sensors coupled to the first end of the block, wherein each of the plurality of sensors is coupled proximal to a corner of the first end of the block, and wherein the reflective film coupled to the first end of the block comprises a first opening proximal to a first corner, a second opening proximal to a second corner, a third opening proximal to a third corner, and a fourth opening proximal to a fourth corner.

19. The method of claim 18 wherein the reflective film disposed between the plurality of scintillation crystals extends from the second end of the block toward the first end of the block.

20. The method of claim 19 wherein the reflective film disposed between the plurality of scintillation crystals comprises a plurality of sections with different lengths.

21. The method of claim 19 wherein the reflective film disposed between the plurality of scintillation crystals comprises a plurality of sections with equal lengths.

22. The method of claim 18 wherein the reflective film coupled to the plurality of sides of the block substantially covers the plurality of sides of the block.

23. The method of claim 18 wherein a first sensor is coupled to the block at the first opening, a second sensor is coupled to the block at the second opening, a third sensor is coupled to the block at the third opening and a fourth sensor is coupled to the block at the fourth opening.

24. The method of claim 18 wherein the scintillation crystals have a surface finish of approximately 4-20 micron $R_a$.

25. The method of claim 18 wherein each of the scintillation crystals comprise a plurality of segments coupled together.

26. The method of claim 18 wherein:
the first end of the block comprises a surface area; and
the plurality of sensors cover less than twenty percent of the surface area of the first end.

27. The method of claim 18 wherein the plurality of sensors cover less than ten percent of the surface area of the first end.

28. An apparatus for optical emission detection, the apparatus comprising:
a block comprising scintillation crystals, wherein:
the block comprises a first end and a second end parallel to the first end;
the block comprises a plurality of sides extending between the first end and the second end; and
the first end of the block comprises a first corner, a second corner, a third corner, and a fourth corner;
reflective film coupled to the plurality of sides of the block and to the first end of the block;
a first light sensor coupled to the block proximal to the first corner;
a second light sensor coupled to the block proximal to the second corner;
a third light sensor coupled to the block proximal to the third corner; and
a fourth light sensor coupled to the block proximal to the fourth corner, wherein the first sensor is coupled to the block at the first opening, the second sensor is coupled to the block at the second opening, the third sensor is coupled to the block at the third opening and the fourth sensor is coupled to the block at the fourth opening.

* * * * *